(12) United States Patent
Ruhnau et al.

(10) Patent No.: US 9,720,148 B2
(45) Date of Patent: Aug. 1, 2017

(54) CAMERA SYSTEM, IN PARTICULAR FOR A VEHICLE, AND METHOD FOR ASCERTAINING PIECES OF IMAGE INFORMATION OF A DETECTION AREA

(71) Applicant: Robert Bosch GmbH, Stuttgart (DE)

(72) Inventors: Paul Ruhnau, Leonberg-Hoefingen (DE); Axel Vogler, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 109 days.

(21) Appl. No.: 14/428,874

(22) PCT Filed: Aug. 26, 2013

(86) PCT No.: PCT/EP2013/067627
§ 371 (c)(1),
(2) Date: Mar. 17, 2015

(87) PCT Pub. No.: WO2014/044497
PCT Pub. Date: Mar. 27, 2014

(65) Prior Publication Data
US 2015/0219809 A1    Aug. 6, 2015

(30) Foreign Application Priority Data

Sep. 21, 2012 (DE) .......................... 10 2012 217 093

(51) Int. Cl.
*H04N 9/04* (2006.01)
*H04N 5/335* (2011.01)
(Continued)

(52) U.S. Cl.
CPC ........... *G02B 5/20* (2013.01); *G06K 9/00791* (2013.01); *H04N 5/238* (2013.01); *H04N 5/2353* (2013.01);
(Continued)

(58) Field of Classification Search
CPC ............. H04N 9/045; H04N 2209/045; H04N 5/35563; H04N 5/35572; H04N 5/35581; H01L 27/14621; H01L 27/14645
(Continued)

(56) References Cited

U.S. PATENT DOCUMENTS 7,466,358 B1 * 12/2008 Kusaka .................. H04N 5/235
348/221.1
8,073,246 B2 * 12/2011 Adams, Jr. ......... H04N 5/23248
382/162
(Continued)

FOREIGN PATENT DOCUMENTS

| DE | 69808024 | 6/2003 |
|---|---|---|
| DE | 102005033863 | 1/2007 |
| DE | 102006055905 | 5/2008 |
| DE | 102010024415 | 12/2011 |

*Primary Examiner* — Ngoc-Yen Vu
(74) *Attorney, Agent, or Firm* — Norton Rose Fulbright US LLP; Gerard Messina

(57) ABSTRACT

A vehicle camera system includes a camera that includes an image sensor, a filter mask, and a control and evaluation device, to which the image sensor outputs an image signal with frames that correspond to different exposure times. The image sensor includes an arrangement of sensor pixels outputting pixel signals, and the filter mask includes an arrangement of filter pixels situated in front of respective ones of the sensor pixels, where different filter pixels have different transmission behavior. The control and evaluation device compares to each other pixel signals (a) contained in the frames of different exposure times, and (b) output by sensor pixels which record light filtered differently by the filter pixels.

24 Claims, 1 Drawing Sheet

(51) Int. Cl.
  *G02B 5/20* (2006.01)
  *H04N 5/355* (2011.01)
  *G06K 9/00* (2006.01)
  *H04N 5/235* (2006.01)
  *H04N 5/238* (2006.01)
  *H04N 5/33* (2006.01)
  *H04N 5/357* (2011.01)
  *H01L 27/146* (2006.01)

(52) U.S. Cl.
  CPC ............... *H04N 5/33* (2013.01); *H04N 5/335* (2013.01); *H04N 5/357* (2013.01); *H04N 5/35563* (2013.01); *H04N 5/35581* (2013.01); *H04N 9/045* (2013.01); *H01L 27/14621* (2013.01); *H04N 2209/045* (2013.01)

(58) Field of Classification Search
  USPC .................................................. 348/271, 267
  See application file for complete search history.

(56) References Cited

U.S. PATENT DOCUMENTS

| | | | |
|---|---|---|---|
| 8,254,635 B2* | 8/2012 | Stein | G06K 9/00798 382/103 |
| 8,294,797 B2* | 10/2012 | Choe | H04N 9/045 348/276 |
| 8,817,140 B2* | 8/2014 | Simon | G06T 3/4015 348/113 |
| 2007/0177014 A1* | 8/2007 | Frenzel | G06K 9/00798 348/148 |
| 2009/0174792 A1 | 7/2009 | Kusaka et al. | |
| 2011/0075000 A1 | 3/2011 | Border et al. | |
| 2013/0027560 A1* | 1/2013 | Seger | H04N 9/735 348/148 |
| 2015/0244923 A1* | 8/2015 | Lee | H04N 9/045 348/234 |

\* cited by examiner

CAMERA SYSTEM, IN PARTICULAR FOR A VEHICLE, AND METHOD FOR ASCERTAINING PIECES OF IMAGE INFORMATION OF A DETECTION AREA

FIELD OF THE INVENTION

The present invention relates to a camera system, in particular for a vehicle, and to a method for ascertaining pieces of image information of a detection area.

BACKGROUND

In general, image sensors of camera systems are read out by a control device as a function of an ambient brightness using different exposure times to avoid underexposure or overexposure.

During the day, the exposure times are therefore in general very short. However, it may thus occur that only briefly illuminating light sources, in particular pulsed light sources, are no longer continuously detected, in particular when the read-out time is within or below the order of magnitude of the pulse duration of the light source. For example, pulse frequencies of light emitting diodes (LEDs) in camera systems in the automotive field are less than 0.1 ms during the day at approximately 90 Hz to 100 Hz read-out times of the image sensors.

To prevent an LED detected by the camera system from flickering, DE 10 2010 024 415 A1 provides for the image sensor to constantly or continuously detect incident light using a maximal read-out time. A pause time, during which the image sensor does not convert the light incident on it into electrical signals or is not sensitive to light, is selected to be lower than a pulse duration of light pulses to be detected, so that the sensor does not "overlook" a light pulse. An attenuation filter or a diaphragm is provided to ensure that the sensor is not overexposed or that the sensor does not go into saturation, the attenuation filter or the diaphragm having to be adapted according to the lighting conditions (during the day or at night) since at night less light strikes the sensor than during the day.

The disadvantage of this approach is that additional means are required in the camera system to vary the diaphragm or the attenuation filter in each case as a function of the lighting conditions.

DE 10 2005 033 863 A1 shows an image recording system in which, in addition to a camera, a radiation sensor is provided, which ascertains an average brightness level of an image scene and compares it to the brightness of an image recorded by the camera. The radiation sensor also senses pulsed light sources by using a longer read-out time. If a discrepancy arises between the two brightness levels, a warning signal, which indicates to the driver that a fault exists in the display representation, is output; and the exposure phase of the camera and the activation phase of the pulsed light source are synchronized, or areas of the images represented on the display are replaced by areas with accordingly longer exposure.

The disadvantage of this approach is that a further radiation source, which must be synchronized with the camera, is required, whereby the manufacturing complexity and costs increase.

DE 698 08 024 T2 describes a further method and an image recording system for generating a video signal having an expanded dynamic range. Such systems are also known as high dynamic range (HDR) images, in which consecutive images are generated using different parameter settings, in particular using different exposure times, so that subsequently an optimized image may be created from image sections having different brightness levels, for example by taking over dark sections from the longer exposed image and lighter sections from the shorter exposed image. In this way, the consecutive frames of the output image signal may directly be set differently, so that a sequence of different frames is generated. For this purpose, different exposure times are fixedly set and the images are subsequently evaluated.

SUMMARY

According to example embodiments of the present invention, a filter mask that includes different filter pixels is provided in front of an image sensor, which includes a pixel arrangement made up of multiple sensor pixels. The filter pixels exhibit different transmission behaviors, for example, different characteristics of a degree of not allowing incident light to partially pass, i.e., to absorb or to reflect it. The different transmission behavior preferably denotes a different attenuation of the intensity which is allowed to pass.

The filter mask includes first and second filter pixels of different transmission behaviors, in particular different attenuation, which are situated in a regular or irregular arrangement or raster in front of the sensor pixels. For example, the first filter pixels provide no attenuating or a moderately attenuating effect, and the second filter pixels provide a stronger attenuating effect.

This may take place, on the one hand, by forming second filter pixels as a gray filter, which attenuates light incident in a relevant wavelength range in each case on a pro-rata basis or proportionally, for example in each case one quarter or half of the incident intensity. As an alternative, the attenuation can also be achieved by a polarization filter, for example, which thus attenuates half the intensity of incident unpolarized light, for example. However, wavelength-selective attenuations are also generally possible, for example with the aid of a color filter, which thus allows only light of a relevant wavelength range to pass and attenuates other wavelength ranges.

The pixel arrangement of the—preferably identically designed—sensor pixels on the image sensor can be divided into individual sensor areas, in which sensor pixels provided with upstream first filter pixels, which hereafter are referred to as first sensor pixels, and sensor pixels provided with upstream second, more strongly attenuating, filter pixels, which hereafter are referred to as second sensor pixels, are situated adjacent or abutting each other, for example three first sensor pixels and one second sensor pixel. At the same incident light intensity, the signal strengths of the first pixel signals output by the first sensor pixels are thus greater than the signal strengths of the second pixel signals output by the second sensor pixels.

Moreover, the image sensor is read out using different read-out times or exposure times. Advantageously, a multi-modal camera control unit is designed with two or more sub-sequences, which are assigned different exposure times. In the case of a two-modal camera control unit, a first sub-sequence with individual first frames, which are each assigned to a shorter first exposure time, and a second sub-sequence made up of second frames, which are each assigned to a greater second exposure time, are thus generated. These sub-sequences advantageously alternate, as is known per se from multimodal camera control units, which are used in particular also for high dynamic range (HDR) camera systems.

In the evaluation, the less strongly attenuated first pixel signals having a shorter exposure time are compared to more strongly attenuated second pixel signals having a longer exposure time. The comparison is carried out in particular between first and second pixel signals of a sensor area, e.g., of preferably mutually abutting sensor pixels. For this purpose, for example, initially mean values may be formed from the first and second pixel signals of a sensor area, which are then used for the comparison.

The comparison takes the different attenuation factors and different exposure times into consideration. This can take place, for example, with the aid of a correction using a fixed correction factor. In the simple case of an attenuation by the second filter pixels by the factor 0.5 compared to the first filter pixels, and a ratio of the exposure times with the factor 2, approximately identical signal strengths, i.e., charge amounts generated by the exposure in the sensor pixels, should thus be ascertained—not considering background noise or sensor noise and without the case of oversaturation.

The present invention is thus based on the idea to compare pixel signals from adjacent or mutually abutting sensor pixels, having different attenuation and different exposure times, to each other to ascertain short-term intensity changes, in particular intensity increases, which are detected during the longer exposure time, but not during the shorter exposure time. In this way, it is possible to detect in particular light pulses of pulsed light sources, such as LEDs, which, due to the short read-out times of the first exposure time, are not detected, if necessary, during the measurements using a longer exposure time. Such intensity contributions can thus initially be ascertained by the comparison. Subsequently, advantageously only one image signal from the pixel signals having a shorter exposure time are used for further image processing, if the comparison shows or suggests that no relevant intensity increases are present.

Initially, the comparison is preferably used to detect possible errors in an image signal having a short exposure, contrary to HDR, for example, where pieces of information are deliberately taken from the multiple modes or exposure times to form the image signal. Contrary to HDR, in particular a comparison of pixel signals of a pixel area that are attenuated to different degrees is also combined with the comparison of the different exposure times.

The filter mask can be regular or irregular. It can regularly cover, e.g., every fourth pixel. An irregularity can be provided to avoid systematic errors due to light points moving vertically in the detected image, for example (in the case of vertical pitch of the host vehicle).

According to the present invention, several advantages are achieved. It is possible to detect short-term light signals, in particular light pulses, such as of LEDs, even if their pulse duration is within or below the order of magnitude of the shorter exposure time. Nonetheless, a high signal quality and thus image quality can be achieved by using for this purpose pixel signals that are less strongly attenuated, or in particular not attenuated, and have short exposure times. As a result of the additional measurement or the second mode having longer exposure times, a comparison can be carried out, which is used to avoid errors or discrepancies due to non-detection of pulsed light sources.

Since the second sensor pixels are thus essentially used for comparison, the number of the second sensor pixels in the pixel area can be selected to be smaller and thus, if necessary, have no relevant impairing effect on the resolution of the non-attenuated or less strongly attenuated first sensor pixels.

The filter mask can in particular also be used for supplementary functions of the camera system. For example, the second filter pixels having a stronger attenuation can be used as a polarization filter, which is used in relevant functions on a supplementary basis. Such a function can be a night vision device, for example, in which the polarized IR radiation, which is reflected by detected objects, is output, the second filter pixels being adjusted to this polarization and allowing light reflected in such a way to pass in a preferred manner or without relevant attenuation. Such a camera system can thus utilize the second filter pixels for the comparison for ascertaining short-term intensity increases during daytime operation, and it can utilize the second filter pixels as a polarization filter for the selective detection of reflected radiation during nighttime operation with active illumination of the surroundings.

In this way, a multifunctional camera system can be created, which allows the detection of short-term light pulses without, or without relevant additional, hardware complexity.

Accordingly, a method according to the present invention for ascertaining pieces of image information is provided. Moreover, a vehicle including such a camera system is provided according to the present invention.

DETAILED DESCRIPTION

Figure 1:
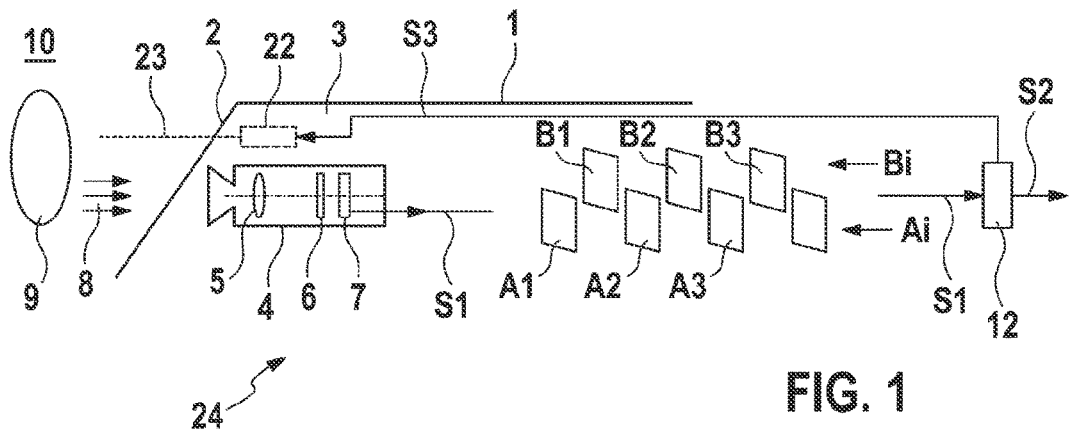
FIG. 1 shows a vehicle including a camera system according to an example embodiment of the present invention.

FIG. 1 schematically shows a windshield 2 and a vehicle interior 3 of a vehicle 1. A camera system 24 includes a control and evaluation device 12 and includes a camera 4 attached in vehicle interior 3. Camera 4 includes a lens 5, an image sensor 7, and a filter mask 6 upstream of the image sensor 7, with respect to a direction of light sensed by camera 4. In an example embodiment, filter mask 6 is advantageously situated or designed directly on image sensor 7. Camera 4 records light 8 of a detection area 9 of vehicle surroundings 10 through windshield 2 and converts this light 8 or the pieces of image information of light 8 into image signals S1, which it outputs to the control and evaluation device 12. Image signals S1 represent—in any suitably appropriate conventional manner of representation—a sequence of frames (images) A1, B1, A2, B2, A3, B3, . . . , control and evaluation device 12 activating and reading out image sensor 7 in a multimodal camera control unit, using two different read-out times (exposure times) $\tau 1$ and $\tau 2$, where $\tau 2 > \tau 1$. The sequence of frames can thus be divided into two sub-sequences Ai, where i=1, 2, 3, . . . (i.e., A1, A2, A3, . . . ), and Bi, where i=1, 2, 3, . . . (i.e., B1, B2, B3, . . . ), the frames of first sub-sequence Ai being read out using the shorter first read-out time $\tau 1$ and the frames of second sub-sequence Bi being read out using the longer second read-out time $\tau 2$. In this example embodiment, sub-sequences Ai and Bi alternate; however, embodiments in which, for example, only every third or fourth image is assigned to second sub-sequence Bi are also possible.

Filter mask 6 includes first filter pixels F1 without absorption or without relevant absorption of light 8. First subareas F1 are thus (at least largely) transparent. Filter mask 6 also includes second filter pixels F2, which cause a relevant absorption of light 8. According to one preferred example embodiment, second filter pixels F2 are gray pixels, or act as gray filters, and thus relatively uniformly absorb or reflect a portion of incident light 8 in a relevant, visible spectral range. According to the shown example embodiment, second filter pixels F2—shown hatched in FIG. 1—are situated in a regular manner, approximately every fourth filter pixel being a second filter pixel F2. In alternative example embodiments, irregular arrangements and/or different ratios of first filter pixels F1 to second filter pixels F2 are provided.

Filter mask 6, with its filter pixels F1 and F2, is situated in front of image sensor 7, which includes any suitably appropriate conventional pixel array of sensor pixels, e.g., in a CMOS or CCD design. The sensor pixels behind first filter pixels F1 are denoted as first sensor pixels P1, and the sensor pixels behind second filter pixels F2 are denoted as second sensor pixels P2. In this way, second sensor pixels P2 undergo a gray filtration, while first sensor pixels P1 do not. First sensor pixels P1 supply pixel signals PS1, and second sensor pixels P2 supply pixel signals PS2.

Figure 2:
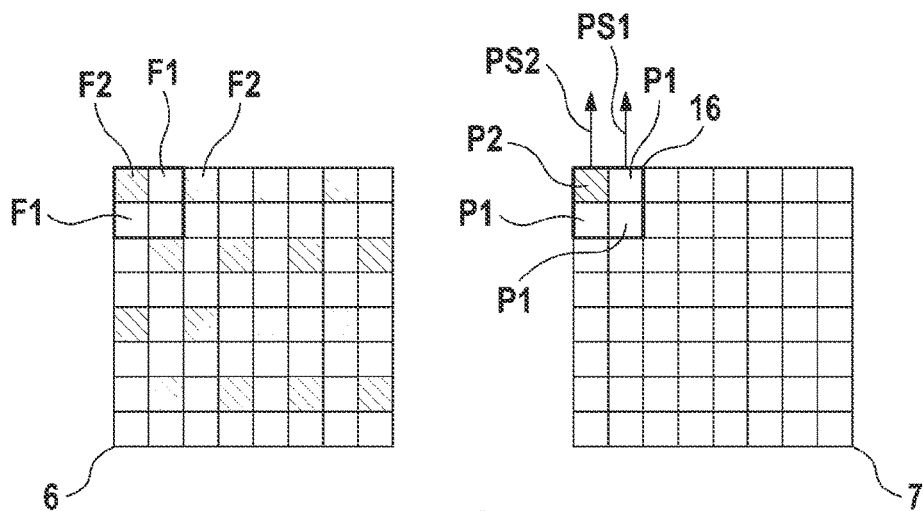
FIG. 2 shows top views of a filter mask and the image sensor of FIG. 1, according to an example embodiment of the present invention.

A pixel area 16 made up of four mutually abutting sensor pixels, which is illustrated in FIG. 2 by a thicker line, contains three first sensor pixels P1 and one second sensor pixel P2. The pixel array made up of sensor pixels P1 and P2 can thus be considered as a raster or an over-raster made up of multiple pixel areas 16.

Image signals S1 thus result as an alternating sequence of frames A1, B1, A2, B2, which each contain first pixel signals PS1 and second pixel signals PS2, which are recorded and processed in control and evaluation device 12.

Control and evaluation device 12 compares pixel signals PS1, PS2 of a shared pixel area 16 of the first frames of first sub-sequence Ai and of the second frames of second sub-sequence Bi to each other. For example, in an example embodiment, an average value of the three first pixel signals PS1 of a respective pixel area 16 is initially determined, the average value being compared to second pixel signal PS2 of the respective pixel area 16 in question, so that the intensity differences due to the lateral offset of sensor pixels P1 and P2 are slightly reduced; otherwise intensity differences due to the lateral offset may be neglected, as is also the case when using color filter masks.

In the comparison, preferably directly consecutive frames Ai and Bi are compared to each other, so that, in a first approximation, a detection area 9, which was not changed by a relative movement or by the travel of vehicle 1, may be assumed.

Thus, four different pixel signal values are obtained by filter mask 7 having two different filter pixels F1, F2 and two modes having different exposure times $\tau_1$, $\tau_2$, namely:

first pixel signals PS1(A) of first sub-sequence Ai, i.e., with a short first exposure time $\tau_1$;
first pixel signals PS1(B) of second sub-sequence Bi, i.e., with a long second exposure time $\tau_2$;
second pixel signals PS2(A) with a short first exposure time $\tau_1$; and
second pixel signals PS2(B) with a long second exposure time $\tau_2$.

The ratio of the attenuation of F2 to F1 is referred to as d, i.e., d<1, and the ratio of $\tau_2$ to $\tau_1$ is referred to as w, i.e., w>1.

In a pixel area 16, PS1(B) is thus the greatest value and PS2(A) is the lowest value in terms of the magnitude of the intensity or signal strength. During the day, P1 may already go into saturation at a longer exposure time $\tau_2$, so that PS1(B) is no longer used.

PS2(B) and PS1(A) should be neither in undersaturation nor in oversaturation, so that, in terms of the magnitude of the intensity or signal strength, with a chronologically unchanged intensity of light 8 (neglecting sensor noise and further influences): PS2(B)=d*w*PS1(A) and PS1(A)=PS2(B)/(d*w).

However, differences may occur, in particular with pulsed light 8. For example, in particular light 8 of LEDs is operated in pulse frequencies of approximately 90 Hz to 100 Hz, i.e., corresponding to frequencies in the range of 0.1 ms. First read-out time $\tau_1$ is in the range of 0.1 ms, for example, while longer second read-out time $\tau_2$ is placed in a time range which detects individual pulses with certainty, e.g., >0.2 ms, for example, in the range of 0.5 ms to 1 ms.

Figure 3:
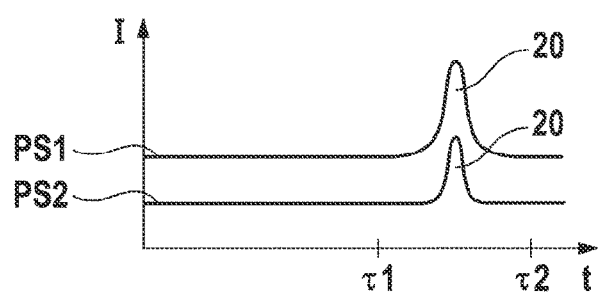
FIG. 3 shows representations of the chronological progression of the radiation intensity impinging on different sensor pixels, according to an example embodiment of the present invention.

FIG. 3 schematically shows intensity I of light 8 as a function of time t, for each of a first sensor pixel P1 and a second sensor pixel P2, i.e., signals PS1 and PS2. Here, an example is shown in which a light pulse 20 falls into the time period $\tau_2$-$\tau_1$, and therefore is not detected by $\tau_1$, but is detected by $\tau_2$. This light pulse 20 is thus detectable in resulting pixel signal PS2(B), but not in resulting PS1(A). Light pulse 20 can also be detected in subsequent $\tau_1$, for example, and can thus occur in a portion PS1(A), but, precisely this is recognized as being problematic.

Thus if [PS1(A)=PS2(B)/(d*w)] is also no longer met within tolerance limits f, which considers sensor noise, e.g., if PS1(A) is not within the range of [f*PS2(B)/(d*w); 1/f*PS2(B)/(d*w)], where f<1, e.g., f=0.8, then a short-term intensity increase that is not detected in $\tau_1$ can be detected. In this frame, PS1(A) is thus recognized as erroneous.

According to one preferred example embodiment, control and evaluation device 12 considers only signals PS1(A) and use these for image evaluation during daytime operation if no error is recognized, and second pixel signals PS2(B) are used only for the comparison to detect whether a light pulse 20 is present in PS1(A). It is recognized here that signals PS1(A), i.e., at a short exposure time $\tau_1$, are of a better quality and generally sufficient for image processing. If an erroneous PS1(A) is recognized, it is replaced by the corresponding PS2(B).

Control and evaluation device 12 subsequently outputs corrected image signals S2, or further signals ascertained therefrom.

Control and evaluation device 12 can also be formed by multiple individual devices, e.g., a control device for activating image sensor 7 or its sensor pixels P1 and P2, and a further evaluation device.

Second filter pixels F2 can also attenuate with the aid of polarization instead of as gray filters, e.g., camera system 24 is equipped as a night vision system with an additional IR lamp 22 on a supplementary basis, which is activated by control signals S3 from control and evaluation device 12 to emit polarized IR radiation 23 into detection area 9, which, after a reflection from an object in detection area 9, is in turn preferably allowed to pass by second filter pixel F2.

The polarization plane of F2 is adapted to the polarization of radiation 23, so that camera 6 is provided in a multifunctional manner, on the one hand, for detecting pulsed LEDs in daytime operation, and, on the other hand, as a night vision system during night-time operation. Different exposure times are set in night-time operation. First pixel signals PS1 without polarization filtration then contain pieces of image information of the ambient light, and second pixel signals PS2 contain pieces of image information of the night vision function.

Moreover, embodiments of second filter pixels F2 with wavelength-selective filtration are also possible. In general, F2 can thus also be used to form a color pattern on a supplementary basis.

Moreover, more than just two different filter pixels F1, F2 can be provided. Moreover, a larger number of exposure times, i.e., a multimodal camera control unit with more than two modes, can also be provided.

The entire camera system 24 thus includes camera 4, control and evaluation device 12, and further devices, such as IR lamp 22, for example.

What is claimed is:

1. A camera system comprising:
    a camera that includes an image sensor and a filter mask; and
    a control and evaluation device, to which the image sensor is configured to output an image signal that includes first frames recorded using a first exposure time and second frames recorded using a second exposure time that is longer than the first exposure time;
    wherein:
        the image sensor includes an arrangement of sensor pixels by which the image sensor is configured to output pixel signals of the first and second frames;
        the filter mask includes an arrangement of filter pixels situated in front of the sensor pixels;
        the filter pixels include first filter pixels that exhibit a first transmission behavior and second filter pixels that exhibit a second transmission behavior, so that the second filter pixels filter light differently than the first filter pixels, the sensor pixels recording the differently filtered light as the pixel signals that are output as the image signal; and
        the control and evaluation device is configured to compare the pixel signals to each other, the pixel signals comprising:
            one or more first pixel signals including a first frame pixel signal and a first filter pixel signal;
            one or more second pixel signals including a second frame pixel signal and the first filter pixel signal;
            one or more third pixel signals including the first frame pixel signal and a second filter pixel signal; and
            one or more fourth pixel signals including the second frame pixel signal and the second filter pixel signal.

2. The camera system of claim 1, wherein:
    the second filter pixels attenuate an intensity of incident light more strongly than the first filter pixels;
    the sensor pixels include first sensor pixels that are each arranged behind a respective one of the first filter pixels and second sensor pixels that are each arranged behind a respective one of the second filter pixels, so that the first sensor pixels are configured to output the first pixel signals, and the second sensor pixels are configured to output the second pixel signals; and
    the comparison includes, for each of at least one pixel area, formed by a respective combination of a group of the sensor pixels that abut each other and that include at least one of the first sensor pixels and at least one of second sensor pixels, comparing pixel signals of the pixel area in at least one of the first frames to pixel signals of the pixel area in at least one of the second frames.

3. The camera system of claim 2, wherein the control and evaluation device is configured to determine whether a result of the comparison is within a tolerance range that is based on a ratio of the exposure times and a ratio of the attenuations of the filter pixels.

4. The camera system of claim 2, wherein the control and evaluation device is configured to determine, based on the comparison, whether a short-term intensity increase is contained in the pixel signals recorded at the second exposure time, which is not contained in the pixel signals recorded at the first exposure time.

5. The camera system of claim 4, wherein:
    the control and evaluation device is configured to correct the image signals generated by the image sensor to produce and output corrected image signals;
    where a result of the determination is that the short-term intensity increase is not detected, the correction is performed using one or more of the first frame pixel signals; and
    where a result of the determination is that the short-term intensity increase is detected, the correction is performed using one or more of the second frame pixel signals.

6. The camera system of claim 2, wherein the control and evaluation device is configured to determine, based on the comparison, whether at least one light pulse is contained in the pixel signals recorded at the second exposure time, which is not contained in the pixel signals recorded at the first exposure time.

7. The camera system of claim 2, wherein the second filter pixels are gray filters that attenuate the intensity of the incident light over a wavelength range of at least one of visible light and infrared light.

8. The camera system of claim 2, further comprising an illumination device configured to emit polarized radiation for illuminating a detection area, wherein:
    the second filter pixels are designed as polarization filters through which the polarized radiation passes after being reflected back from the detection area;
    the control and evaluation device is configured to evaluate the second pixel signals (a) in a first mode, in which the comparison is performed, the comparison being of the second pixel signals from the second frames to the first pixel signals from the first frames, and (b) in a second mode for a detection of reflected radiation.

9. The camera system of claim 8, wherein the illumination device is an IR lamp.

10. The camera system of claim 8, wherein the first mode is a daytime mode and the second mode is a night vision mode.

11. The camera system of claim 2, wherein the second filter pixels are wavelength-selective-filtering color pixels, and the control and evaluation device additionally is configured to perform a multimodal high dynamic range (HDR) evaluation of the image signal.

12. The camera system of claim 1, wherein:
    the second filter pixels attenuate an intensity of incident light more strongly than the first filter pixels;
    the sensor pixels include first sensor pixels that are each arranged behind a respective one of the first filter pixels and second sensor pixels that are each arranged behind a respective one of the second filter pixels, so that the first sensor pixels are configured to output first ones of the pixel signals, and the second sensor pixels are configured to output second ones of the pixel signals; and for each of at least one pixel area, formed by a respective combination of a group of the sensor pixels that abut each other and that include at least one of the first sensor pixels and at least one of second sensor pixels, the control and evaluation device is configured to compare the first pixel signals of the pixel area in at least one of the first frames to the second pixel signals of the pixel area in at least one of the second frames.

13. The camera system of claim 12, wherein the first filter pixels are designed not to attenuate the intensity of the incident light, and the second filter pixels are designed to attenuate the intensity of the incident light.

14. The camera system of claim 1, wherein the first and second frames includes at least two of the first frames and two of the second frames in an alternating sequence.

15. The cameras system of claim 1, wherein the camera system is a vehicle camera system.

16. The camera system of claim 1, wherein the control and evaluation device determines a first average value of the one or more first pixel signals and the one or more second pixel signals, determines a second average value of the one or more third pixel signals and the one or more fourth pixel signals, and compares the first average value to the second average value.

17. The camera system of claim 1, wherein the comparison includes comparing directly consecutive first frames and second frames to each other to determine an approximation of a detection area.

18. The camera system of claim 1, wherein the control and evaluation device performs image evaluation using only the one or more first pixel signals in the absence of a detection of an error or a short-term intensity increase.

19. A vehicle comprising:
a camera system configured to detect a detection area in vehicle surroundings outside the vehicle, the camera system including:
  a camera that includes an image sensor and a filter mask; and
  a control and evaluation device, to which the image sensor is configured to output an image signal that includes first frames recorded using a first exposure time and second frames recorded using a second exposure time that is longer than the first exposure time;
wherein:
  the image sensor includes an arrangement of sensor pixels by which the image sensor is configured to output pixel signals of the first and second frames;
  the filter mask includes an arrangement of filter pixels situated in front of the sensor pixels;
  the filter pixels include first filter pixels that exhibit a first transmission behavior and second filter pixels that exhibit a second transmission behavior, so that the second filter pixels filter light differently than the first filter pixels, the sensor pixels recording the differently filtered light as the pixel signals that are output as the image signal; and
  the control and evaluation device is configured to compare the pixel signals to each other, the pixel signals comprising:
    one or more first pixel signals including a first frame pixel signal and a first filter pixel signal;
    one or more second pixel signals including a second frame pixel signal and the first filter pixel signal;
    one or more third pixel signals including the first frame pixel signal and a second filter pixel signal; and
    one or more fourth pixel signals including the second frame pixel signal and the second filter pixel signal.

20. A method for ascertaining pieces of image information of a detection area using a camera, the method comprising:
detecting, on an image sensor, incident light that has passed through a filter mask, wherein:
  the filter mask includes first filter pixels and includes second filter pixels that filter or attenuate respective portions of the incident light more strongly than the first filter pixels;
  the image sensor includes, in a pixel area, abutting first sensor pixels and second sensor pixels;
  the first sensor pixels record the incident light that has passed through the first filter pixels; and
  the second sensor pixels record the incident light that has passed through the second filter pixels;
reading out, by a multimodal camera control unit, data of the image sensor using at least one first exposure time and at least one second exposure time that is longer than the first exposure time; and
comparing, by the multimodal camera control unit, pixel signals of the read out data to each other, the pixel signals comprising:
  one or more first pixel signals including a first frame pixel signal having the first exposure time and a first filter pixel signal output by the first sensor pixels;
  one or more second pixel signals including a second frame pixel signal having the second exposure time and the first filter pixel signal;
  one or more third pixel signals including the first frame pixel signal and a second filter pixel signal output by the second sensor pixels; and
  one or more fourth pixel signals including the second frame pixel signal and the second filter pixel signal.

21. The method of claim 20, further comprising determining, by the multimodal camera control unit and based on the comparison, whether there are any intensity contributions contained in the second exposure time that are not contained in the first exposure time.

22. The method of claim 21, wherein:
the comparison includes comparing the first pixel signals recorded at the first exposure time to the second pixel signals recorded at the second exposure time;
the method further comprises generating a corrected image signal, in which the first pixel signals recorded at the first exposure time are corrected as a function of the comparison; and
if a result of the determination is that there is no detection of any intensity contribution contained in the second exposure time that is not contained in the first exposure time, then only the first pixel signals are used to generate the corrected image signal.

23. A camera system comprising:
a camera that includes an image sensor and a filter mask; and
a control and evaluation device, to which the image sensor is configured to output an image signal that includes first frames recorded using a first exposure time and second frames recorded using a second exposure time that is longer than the first exposure time;
wherein:
  the image sensor includes an arrangement of sensor pixels by which the image sensor is configured to output pixel signals of the first and second frames;
  the filter mask includes an arrangement of filter pixels situated in front of the sensor pixels;

the filter pixels include first filter pixels that exhibit a first transmission behavior and second filter pixels that exhibit a second transmission behavior, so that the second filter pixels filter light differently than the first filter pixels, the sensor pixels recording the differently filtered light as the pixel signals that are output as the image signal; and the control and evaluation device is configured to compare the pixel signals of the first frames to pixel signals of the second frames, the compared pixel signals including pixels signals corresponding to recorded light obtained via the first filter pixels and recorded light obtained via the second filter pixels, wherein the second filter pixels attenuate an intensity of incident light more strongly than the first filter pixels and wherein the control and evaluation device is configured to determine whether a result of the comparison is within a tolerance range that is based on a ratio of the exposure times and a ratio of the attenuations of the filter pixels.

24. A camera system comprising:

a camera that includes an image sensor and a filter mask;

a control and evaluation device, to which the image sensor is configured to output an image signal that includes first frames recorded using a first exposure time and second frames recorded using a second exposure time that is longer than the first exposure time;

wherein:

the image sensor includes an arrangement of sensor pixels by which the image sensor is configured to output pixel signals of the first and second frames;

the filter mask includes an arrangement of filter pixels situated in front of the sensor pixels;

the filter pixels include first filter pixels that exhibit a first transmission behavior and second filter pixels that exhibit a second transmission behavior, so that the second filter pixels filter light differently than the first filter pixels, the sensor pixels recording the differently filtered light as the pixel signals that are output as the image signal; and the control and evaluation device is configured to compare the pixel signals of the first frames to pixel signals of the second frames, the compared pixel signals including pixels signals corresponding to recorded light obtained via the first filter pixels and recorded light obtained via the second filter pixels; and an illumination device configured to emit polarized radiation for illuminating a detection area, wherein:

the second filter pixels are designed as polarization filters through which the polarized radiation passes after being reflected back from the detection area; and the control and evaluation device is configured to evaluate the second pixel signals (a) in a first mode, in which the comparison is performed, the comparison being of the second pixel signals from the second frames to the first pixel signals from the first frames, and (b) in a second mode for a detection of reflected radiation.

\* \* \* \* \*